United States Patent
Mang et al.

(10) Patent No.: US 7,984,405 B2
(45) Date of Patent: Jul. 19, 2011

(54) METHOD AND APPARATUS FOR DETERMINING THE TIMING OF AN INTEGRATED CIRCUIT DESIGN

(75) Inventors: Yiu-Chung Mang, Toronto (CA); Pei-Hsin Ho, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 262 days.

(21) Appl. No.: 11/972,521

(22) Filed: Jan. 10, 2008

(65) Prior Publication Data

US 2008/0168411 A1    Jul. 10, 2008

Related U.S. Application Data

(60) Provisional application No. 60/879,820, filed on Jan. 10, 2007.

(51) Int. Cl.
    *G06F 17/50* (2006.01)
(52) U.S. Cl. .......................................... 716/110
(58) Field of Classification Search .................. 716/1, 6, 716/110
    See application file for complete search history.

(56) References Cited

U.S. PATENT DOCUMENTS

| | | | |
|---|---|---|---|
| 6,546,541 B1 * | 4/2003 | Petranovic et al. | 716/18 |
| 6,775,808 B1 * | 8/2004 | Raje et al. | 716/4 |
| 6,973,632 B1 * | 12/2005 | Brahme et al. | 716/113 |
| 7,010,767 B2 * | 3/2006 | Elassaad et al. | 716/114 |
| 7,243,323 B2 * | 7/2007 | Williams et al. | 716/113 |
| 7,434,187 B2 * | 10/2008 | Brahme et al. | 716/126 |
| 7,900,165 B2 * | 3/2011 | Oh et al. | 703/14 |
| 2003/0051222 A1 * | 3/2003 | Williams et al. | 716/12 |
| 2004/0221253 A1 * | 11/2004 | Imper et al. | 716/13 |
| 2004/0243964 A1 * | 12/2004 | McElvain et al. | 716/12 |
| 2004/0257207 A1 * | 12/2004 | Elassaad et al. | 340/425.1 |

* cited by examiner

*Primary Examiner* — Jack Chiang
*Assistant Examiner* — Suchin Parihar
(74) *Attorney, Agent, or Firm* — Park, Vaughan, Fleming & Dowler LLP

(57) ABSTRACT

A system that determines the timing of an integrated circuit (IC) design is presented. During operation, the system receives a netlist for the IC design, wherein the netlist specifies the placement of cells within the IC design. Next, the system estimates capacitances for cells within the IC design based on analytic models of the cells. The system then estimates the post-physical-optimization timing of the IC design based on the netlist, the capacitances, and the analytic models, wherein the post-physical-optimization timing is estimated without performing physical optimization.

29 Claims, 8 Drawing Sheets

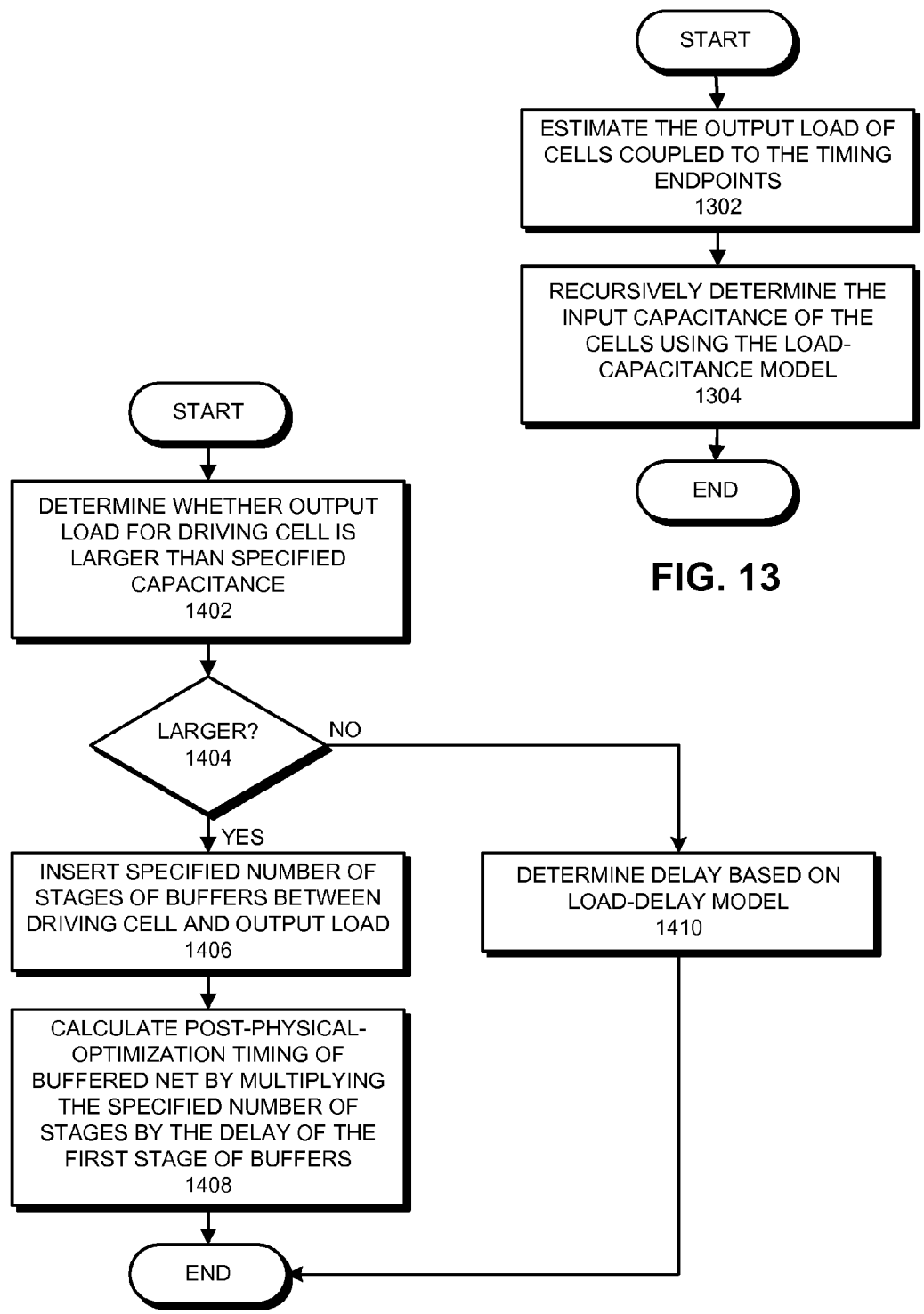

METHOD AND APPARATUS FOR DETERMINING THE TIMING OF AN INTEGRATED CIRCUIT DESIGN

RELATED APPLICATION

This application hereby claims priority under 35 U.S.C. §119 to U.S. Provisional Patent Application No. 60/879,820 filed 10 Jan. 2007, entitled "Quickly Predicting Post-Physical-Optimization Timing of a Design Without Physical Optimization," by inventors Freddy Y. C. Mang and Pei-Hsin Ho.

BACKGROUND

1. Field of the Invention

The present invention relates to techniques for determining the timing of an IC design. More specifically, the present invention relates to a method and apparatus for determining the post-physical-optimization timing of an IC design without performing physical optimizations.

2. Related Art

Physical implementation tools for integrated circuits (ICs) are typically used to improve the performance of a design and the predictability of the design flow, and in doing so, these tools improve the productivity of the designer.

Designers typically require early feedback regarding the feasibility of various design styles and floorplans during design exploration. A fast and accurate prediction of the post-physical-optimization timing can (1) reduce the turnaround time of floorplan redesign, (2) reduce the number of design iterations, and (3) eliminate late design-cycle surprises. Hence, it is desirable to obtain a fast and accurate prediction of the post-physical-optimization (i.e., post-physical-synthesis) timing of the design at an early stage in the design process.

Moreover, large designs (e.g., greater than five million gates) often cannot be optimized in a flat layout due to computing resources constraints. These designs are often partitioned or designed hierarchically, so that smaller sub-designs can be optimized individually. One key task during the partitioning process is budgeting, which involves properly assigning timing constraints to the sub-designs so that the sub-designs are neither over-constrained nor under-constrained. For example, in FIG. 3, while optimizing the path between flip-flops 300-301, if the path between flip-flop 300 and point 304 is easy to optimize, while the path between point 302 to flip-flop 301 is hard to optimize, a timing budgeter typically assigns a more stringent timing constraint to the former path, while assigning a more lenient timing constraint to the latter path. A quick and accurate post-physical-optimization timing prediction can quantify the "potential for optimization" of a path, which facilitates more accurate time budgeting.

Furthermore, timing closure can be achieved by having good placement of cells and hard macros. Timing-driven placement places together cells that have large delays between them, which reduces the delays. A timing-driven placer typically considers the "potential for optimization" of the nets and cells, so that nets that are hard to optimize are shortened, and cells that are hard to optimize are placed together.

Presently, the only way to determine the post-physical-optimization timing of an IC design is to first perform physical optimization on the IC design. Unfortunately, physical optimization can sometimes take days to complete. If a timing error is discovered after performing physical optimization, the design must be changed before physical optimization is performed again. This iterative process is costly.

Hence what is needed is a method and apparatus for determining the timing of an IC design without the problems described above.

SUMMARY

Some embodiments of the present invention provide a system that determines the timing of an integrated circuit (IC) design. During operation, the system receives a netlist for the IC design, wherein the netlist specifies the placement of cells within the IC design. Next, the system estimates capacitances for cells within the IC design based on analytic models of the cells. The system then estimates the post-physical-optimization timing of the IC design based on the netlist, the capacitances, and the analytic models, wherein the post-physical-optimization timing is estimated without performing physical optimization.

In some embodiments, the netlist includes logic that has been substantially optimized using a pre-placement-based logic optimization technique that does not account for the placement of logic while performing logic optimization.

In some embodiments, prior to estimating the capacitances for the cells based on the analytic models of the cells, the system generates the analytic models of the cells within the IC design.

In some embodiments, while generating the analytic models of the cells, the system generates an analytic model for each logical function within the IC design.

In some embodiments, while generating the analytic model for each logical function, the system generates a load-delay model of the logical function which returns the minimum delay achievable for the logical function for a given output load. The system then generates a load-capacitance model of the logical function which returns the input capacitance of a cell that achieves the minimum delay for a given output load.

In some embodiments, while generating the load-delay model of the logical function, the system determines the delay as a function of the output load for each cell that implements the logical function. Next, the system determines the minimum delay achievable as a function of output load for the logical function from the determined delays. The system then fits the minimum delay achievable as a function of output load to a piecewise linear function.

In some embodiments, while generating the load-capacitance model of the logical function, the system determines the input capacitance of the cell that achieves the minimum delay for a given output load. The system then fits the input capacitance as a function of output load to a piecewise-linear function.

In some embodiments, while estimating capacitances for cells within the IC design based on the analytic models of the cells, the system starts from timing endpoints of the IC design and estimates the output load of cells coupled to the timing endpoints. The system then recursively determines the input capacitance of the cells using the load capacitance model until the inputs to the IC design are reached.

In some embodiments, the load on cells coupled to the timing endpoints includes one or more of: the input capacitance of a buffer used for buffer chain insertion; the input capacitance of a repeater buffer used to drive a long net; and the sum of the capacitance of the net coupled to the timing endpoints and the load caused by the input to the next stage of cells coupled to the timing endpoints.

In some embodiments, for nets which are less than or equal to a specified length, while estimating the post-physical-optimization timing of the IC design, the system determines whether an output load for the driving cell is larger than a specified capacitance. If so, the system inserts a specified number of stages of buffers between the driving cell and the output load, wherein the drive strength of the buffers in a given stage is a specified factor more than the drive strength of the buffers in the previous stage. The system then calculates the post-physical-optimization timing of the buffered net by multiplying the specified number of stages by the delay of the first stage of buffers. Otherwise, the system determines the delay based on the load-delay model.

In some embodiments, for nets which are greater than a specified length, while estimating the post-physical-optimization timing of the IC design, the system generates a virtual route for the net. The system then inserts a specified number of stages of repeaters a specified distance from each other along the virtual route for the net. Next, the system calculates the delay between each stage of repeaters along the virtual route for the net. The system then sums the calculated delays between the stages of repeaters to produce the post-physical-optimization timing for the net.

In some embodiments, the system inserts a repeater after a driver of the net.

In some embodiments, if the virtual route overlaps with a macro which does not allow the placement of repeaters, the system inserts a repeater after the macro.

In some embodiments, the size of the repeater for a given stage is a specified factor greater than the size of the repeater in the previous stage.

BRIEF DESCRIPTION OF THE FIGURES

FIG. 13 presents a flow chart illustrating the process of estimating capacitances for cells in accordance with an embodiment of the present invention.

FIG. 14 presents a flow chart illustrating the process of inserting buffers to drive large loads in accordance with an embodiment of the present invention.

Table 1 presents exemplary comparisons between the results obtained from embodiments of the present invention and results obtained from physical synthesis in accordance with an embodiment of the present invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer readable media now known or later developed.

The methods and processes described in the detailed description can be embodied as code, data structures, and/or data, which can be stored on a computer-readable storage medium as described above. When a computer system reads and executes the code and/or data stored on the computer-readable storage medium, the computer system perform the methods and processes embodied as code, data structures, and/or data and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Flow Summary and Context

Figure 1:
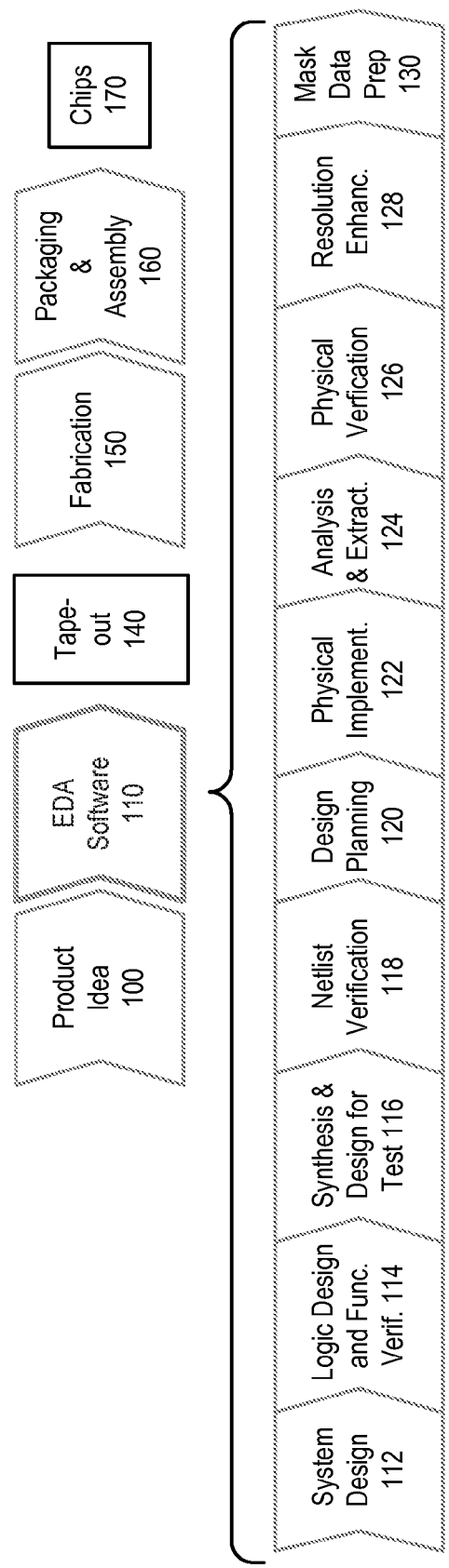
FIG. 1 presents a simplified representation of an exemplary digital ASIC design flow.

Before proceeding further with the description, it may be helpful to place this process in context. FIG. 1 presents a simplified representation of an exemplary digital ASIC design flow. At a high level, the process starts with the product idea (step 100) and is realized in an EDA software design process (step 110). When the design is finalized, it can be taped-out (event 140). After tape out, the fabrication process (step 150) and packaging and assembly processes (step 160) occur resulting, ultimately, in finished chips (result 170).

The EDA software design process (step 110) is actually composed of a number of steps 112-130, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components steps of the EDA software design process (step 110) will now be provided.

System design (step 112): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect, SaberR, System Studio, and DesignWare® products. Note that Saber is a registered trademark of SabreMark Limited Partnership.

Logic design and functional verification (step 114): At this stage, the VHDL, Verilog, or SystemVerilog code for modules in the system is written and the design is checked for functional accuracy. More specifically, does the design as checked to ensure that produces the correct outputs. Exemplary EDA software products from Synopsys, Inc. that can be used at this step include VCS®, VERA®, DesignWare®, Magellan™, Formality®, ESP and LEDA® products.

Synthesis and design for test (step 116): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Physical Compiler®, Test Compiler, Power Compiler™, FPGA Compiler, Tetramax®, and DesignWare™ products.

Netlist verification (step 118): At this step, the netlist is checked for compliance with timing constraints and for correspondence with the VHDL/Verilog source code. Exemplary EDA software products from Synopsys, Inc. that can be used at this step include Formality, PrimeTime, and VCS products.

Design planning (step 120): Here, an overall floorplan for the chip is constructed and analyzed for timing and top-level routing. Exemplary EDA software products from Synopsys, Inc. that can be used at this step include Astro™ and IC Compiler products.

Note that embodiments of the present invention are directed to determining the timing of an IC design without performing physical implementation (i.e., step 122).

Physical implementation (step 122): The placement (positioning of circuit elements) and routing (connection of the same) occurs at this step. Exemplary EDA software products from Synopsys, Inc. that can be used at this step include the Astro and IC Compiler products.

Analysis and extraction (step 124): At this step, the circuit function is verified at a transistor level, this in turn permits what-if refinement. Exemplary EDA software products from Synopsys, Inc. that can be used at this step include Astro-Rail™, PrimeRail, PrimeTime®, and Star RCXT™ products.

Physical verification (step 126): At this step various checking functions are performed to ensure correctness for: manufacturing, electrical issues, lithographic issues, and circuitry. Exemplary EDA software products from Synopsys, Inc. that can be used at this step include the Hercules™ product.

Resolution enhancement (step 128): This step involves geometric manipulations of the layout to improve manufacturability of the design. Exemplary EDA software products from Synopsys, Inc. that can be used at this step include Proteus, ProteusAF, and PSMGen products.

Mask data preparation (step 130): This step provides the "tape-out" data for production of masks for lithographic use to produce finished chips. Exemplary EDA software products from Synopsys, Inc. that can be used at this step include the CATS® family of products.

Note that VCS, VERA, DesignWare, Magellan, Formality, LEDA, Design Compiler, Physical Compiler, Power Compiler, Tetramax, DesignWare, Astro, Astro-Rail, PrimeTime, Star-RCXT, Hercules, and CATS are trademarks or registered trademarks of Synopsys, Inc. in the United States and other countries.

Computer System

Figure 2A:
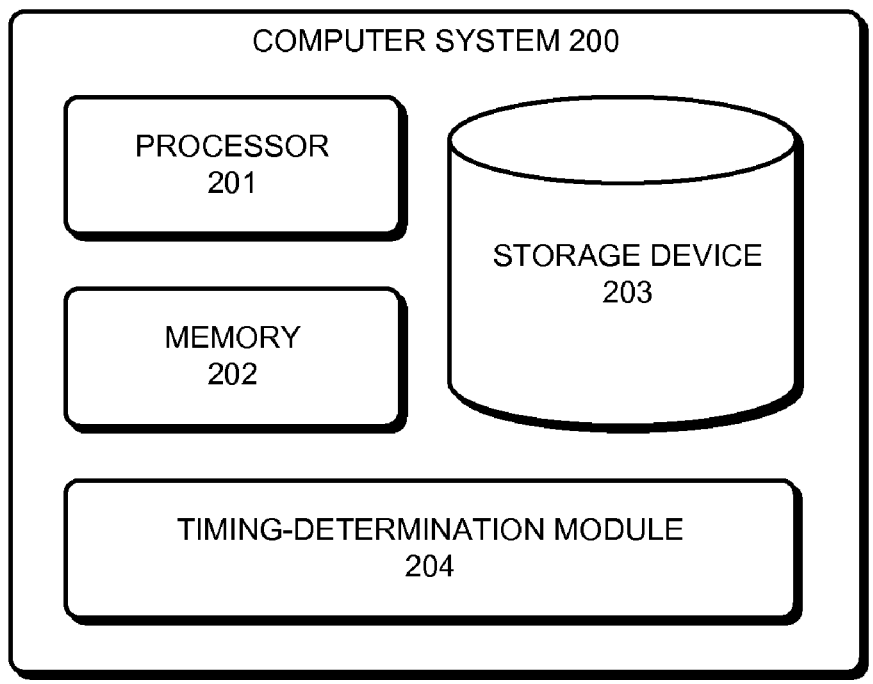
FIG. 2A presents a block diagram of a computer system in accordance with an embodiment of the present invention.

FIG. 2A presents a block diagram illustrating a computer system 200 in accordance with an embodiment of the present invention. Computer system 200 includes processor 201, memory 202, storage device 203, and timing-determination module 204.

Processor 201 can generally include any type of processor, including, but not limited to, a microprocessor, a mainframe computer, a digital signal processor, a personal organizer, a device controller and a computational engine within an appliance. Memory 202 can include any type of memory, including but not limited to, dynamic random access memory (DRAM), static random access memory (SRAM), flash memory, read only memory (ROM), and any other type of memory now known or later developed. Storage device 203 can include any type of non-volatile storage device that can be coupled to a computer system. This includes, but is not limited to, magnetic, optical, and magneto-optical storage devices, as well as storage devices based on flash memory and/or battery-backed up memory.

In some embodiments of the present invention, timing-determination module 204 is separate from computer system 200. Note that timing-determination module 204 is described in more detail below with reference to FIG. 2B.

Figure 2B:
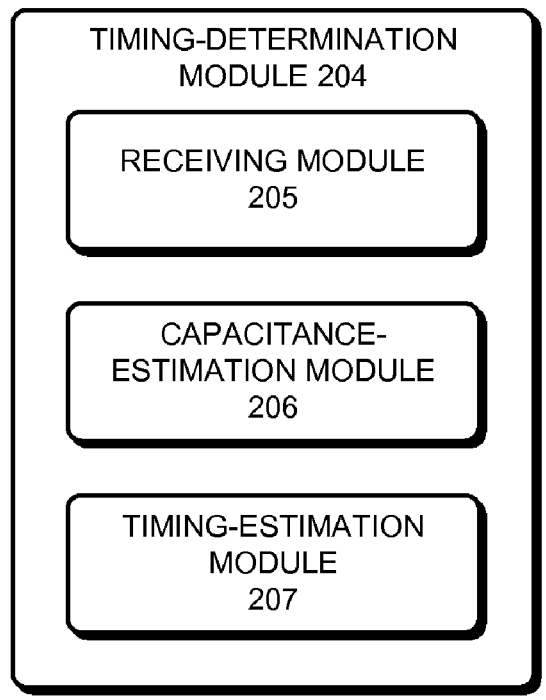
FIG. 2B presents a block diagram of a failure-detection module in accordance with an embodiments of the present invention.
Figure 3:
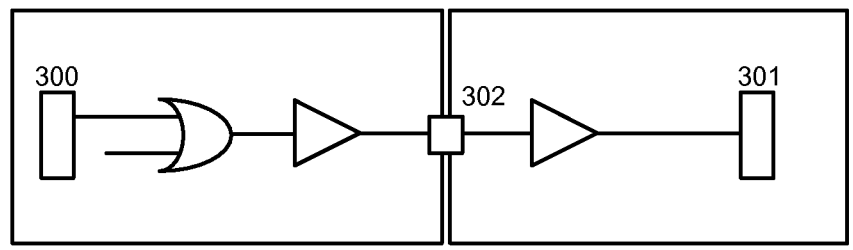
FIG. 3 presents a block diagram illustrating a timing path between two flip-flops in accordance with an embodiment of the present invention.

FIG. 2B presents a block diagram of timing-determination module 204 in accordance with an embodiment of the present invention. Timing-determination module 204 includes receiving module 205, capacitance-estimation module 206, and timing-estimation module 207. Receiving module 205 is configured to receive a netlist for the IC design, wherein the netlist specifies the placement of cells within the IC design. Capacitance-estimation module 206 is configured to estimate capacitances for cells within the IC design based on analytic models of the cells. Timing-estimation module 207 is configured to estimate the post-physical-optimization timing of the IC design based on the netlist, the capacitances, and the analytic models, wherein the post-physical-optimization timing is estimated without performing physical optimization. In some embodiments, one or more of module 205, capacitance-estimation module 206, and timing-estimation module 207 are included in one or more integrated circuit (IC) chips. For example, these IC chips can include, but are not limited to, application-specific integrated circuit (ASIC) chips, field-programmable gate arrays (FPGAs), and other programmable-logic devices now known or later developed.

Overview

Some embodiments of the present invention provide "virtual physical synthesis" (VPS). In some embodiments, VPS takes a placed pre-placement-based-logic-optimization netlist (i.e., a netlist where the logic has been optimized by a logic optimization technique that does not account for the placement of cells) and estimates the timing of the design after physical optimization without actually modifying the placement or the netlist. In some embodiments, VPS estimates the post-physical-optimization timing by using analytical models for a subset of the placement-based logic optimization techniques: (1) buffer chain insertion, (2) gate sizing and (3) repeater insertion. These optimization techniques, as they are applied to VPS, are discussed below.

Buffer Chain Insertion

In some embodiments, to drive a large load, a physical synthesis tool typically inserts a buffer chain in front of the original driver. The total delay of a buffer chain is referred to as the insertion delay of the buffer chain. The library is assumed to contain enough buffers of different sizes so that the buffers are approximately continuously sizable. Note that the purpose of VPS is to estimate the timing after physical optimization so that the above assumption is reasonable.

For a buffer B driving a load L with input transition time t, let transition$_B$(t, L) and delay$_B$(t, L) be the output transition time at the output of the buffer B and the delay through B, respectively. The gain g of the buffer is defined as L/C where C is the input capacitance of the buffer B. According to the logical effort theory, to minimize insertion delay, each buffer in the buffer chain should have the same gain g. Such a buffer chain can be modeled as a buffer tree that (1) is rooted at the same leftmost buffer as the buffer chain, (2) has g times as many buffers in the next level as in the current level, and (3) has the same number of levels as the buffer chain (see FIGS. 4A and 4B).

Figure 4A:
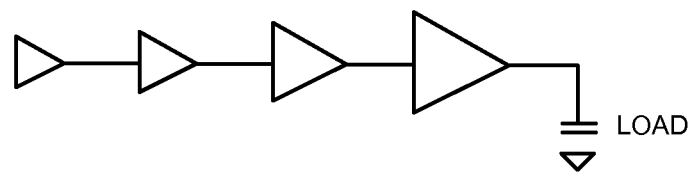
FIG. 4A presents a block diagram of an exemplary buffer chain in accordance with an embodiment of the present invention.
Figure 4B:
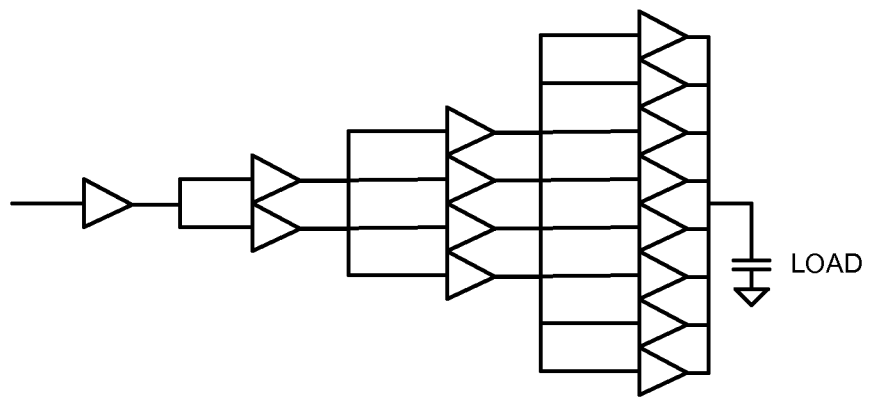
FIG. 4B presents a block diagram of an exemplary buffer chain that is equivalent to the buffer chain illustrated in FIG. 4A in accordance with an embodiment of the present invention.

The buffer tree illustrated in FIG. 4B has the same insertion delay as the original buffer chain illustrated in FIG. 4A. Moreover, each level of the buffer tree has the same delay, so the insertion delay of the buffer tree is the delay of one level multiplied by the number of levels. Thus, the buffer chain insertion problem has been reduced to the following problem: given a load L, the buffer B and the level N is computed for the buffer tree rooted at the buffer B such that the insertion delay of the buffer tree is minimized.

For a buffer B with input capacitance C and a gain g, a transition delay t is selected such that both the input and output transition times of B are equal to t (i.e., t=transition$_B$(t, gC)). For a buffer chain driving a load L, the number of levels N of buffers required is N=log(L/C)/log(g), and the insertion delay is therefore insDelay$_B$(L,g)=N·delay$_B$(t,gC).

Since the delay function of the buffer B is convex in the parameter g, the insertion delay function insDelay$_B$ is also convex in g. Hence, a minimum value for the insertion delay exists. In some embodiments, all the buffers in the buffer library are iterated through and the buffer B* is chosen so that B* gives the minimum insertion delay, wherein the associated gain of B* is g*. Note that the buffer B* and gain g* are independent of the size of the load L, and as a result, the same buffer and gain can be used for all different loads.

In some embodiments, the nominal transition delay t* is chosen so that t*=transition$_B$*(t*, g*, C*). This nominal transition delay is used for modeling the gate sizing and repeater insertion techniques described below.

Gate Sizing

In some embodiments, an analytical model is used to estimate the impact of gate sizing on delay. In these embodiments, the input transition delay is assumed to be the nominal input transition delay t* calculated above. All input pins of a cell are also assumed to be symmetric (i.e., they are of the same input-to-output delay and capacitance). In some embodiments, for each class of cells of the same logic function $f$ in the library (e.g., all 2-input AND cells), two piecewise linear functions are calculated: (1) given a load, the load-delay function returns the minimum delay for the logic function $f$, and (2) the load-capacitance function returns the input capacitance of the cell that realizes the minimum delay. Note that in the logical effort theory, both of these two functions are linear. This analytical model can be considered as a generalization of the logical effort theory.

Figure 5:
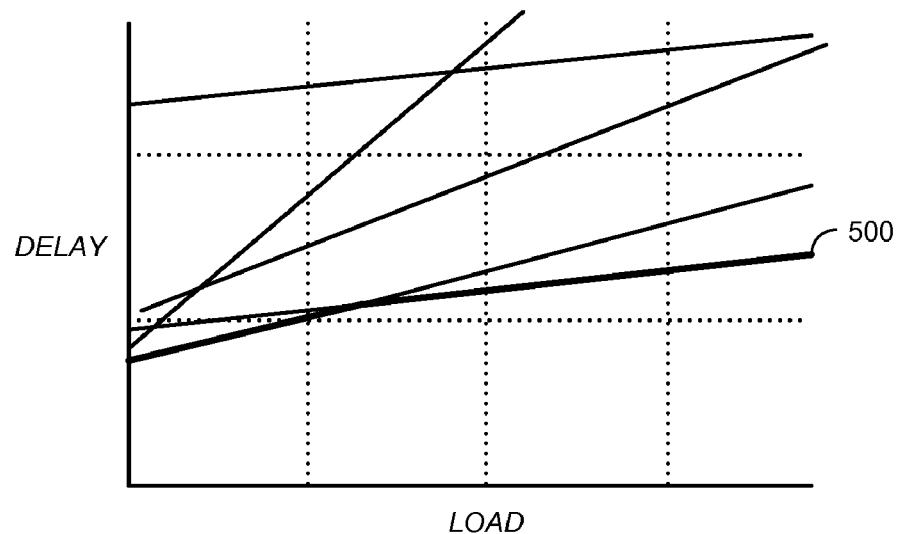
FIG. 5 presents a graph illustrating a load-delay model for a logic function in accordance with an embodiment of the present invention.

In some embodiments, the load-delay function is determined as follows. For each cell of the same logical function $f$, the load-delay curve is plotted (as in FIG. 5). Then, for each output load, the minimum delay is recorded (bolded curve 500) among all cells of the same logical function $f$ and these data points are fit by a bilinear function as follows.

$$\text{Delay}_{min}(\text{load}) = \begin{cases} a \times \text{load} + b, & \text{if load} \le e \\ c \times \text{load} + d, & \text{if load} > e \end{cases}$$

where a and c are slopes in a point-slope line function, b and d are intercept points in the point-slope line function, and e is a point at which the slope of the load-delay function changes (i.e., a new line segment). In some embodiments, a piecewise-linear function can be used for the load-delay function. In other words, more line segments are used.

Figure 6:
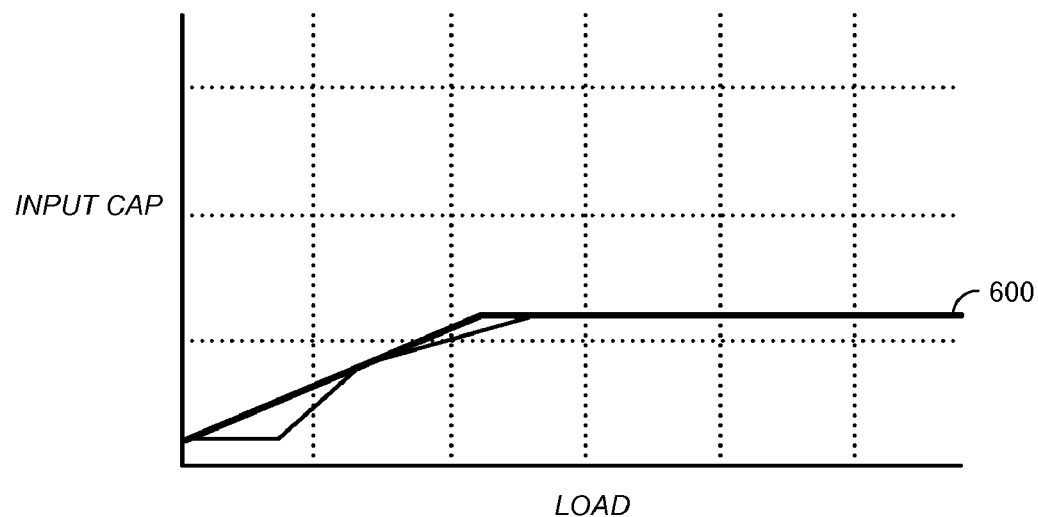
FIG. 6 presents a load-capacitance model for the logic function illustrated in FIG. 5 in accordance with an embodiment of the present invention.

In some embodiments, the load-capacitance function is computed as follows. For each output load, the input capacitance of the cell that realizes the minimum delay is recorded and these data points are fit by a piecewise-linear function as follows (see bold curve 600 in FIG. 6):

$$\text{inCap}(\text{load}) = \begin{cases} C_{min}, & \text{if load} \le c1 \\ a \times \text{load} + b, & \text{if } c1 < \text{load} \le c2 \\ C_{max}, & \text{if load} > c2 \end{cases}$$

where a is a slope for a point-slope line function, b is an intercept point for the point-slope line function, and c1 and c2 are points at which the slope of the load-capacitance function changes.

Macro-Aware Repeater Insertion

The delay of an unbuffered net is quadratic to the length of the net. Physical synthesis tools typically insert repeaters (buffers or inverters) to the net and make the delay of the net linear in length. In some embodiments, VPS determines a repeater for the repeater insertion. In some embodiments, this chosen repeater is used everywhere and is inserted in the net at equal distance from each other.

In some embodiments, the Elmore delay model can be used as the wire delay model. Given a repeater B with output resistance R and input capacitance C, the repeater-to-repeater delay is:

$$d = R(c \cdot l + C) + rl(c \cdot l/2 + C) + \text{delay}_B(t^*, c \cdot l + C),$$

where l is the inter-repeater distance, r and c are the wire resistance and capacitance per unit length, respectively, t* is the nominal delay computed above, and delay$_B$(t, load) is the delay of the repeater B given input transition time t and output load load.

In some embodiments, for a long wire of length L, the delay D=d·L/l is the number of repeaters times the repeater-to-repeater delay. Since the delay function is convex in l, a minimum delay D(L, l*, B) exists. Let l* be the optimal inter-repeater distance. Then the optimal delay D(L, l*, B) is linear in L. The buffers and inverters in the library are then iterated through to search for the repeater B* such that the delay per unit wire length $D^*(L, l^*, B^*)/L$ is minimum. Note that this number is independent of the length L.

Figure 7:
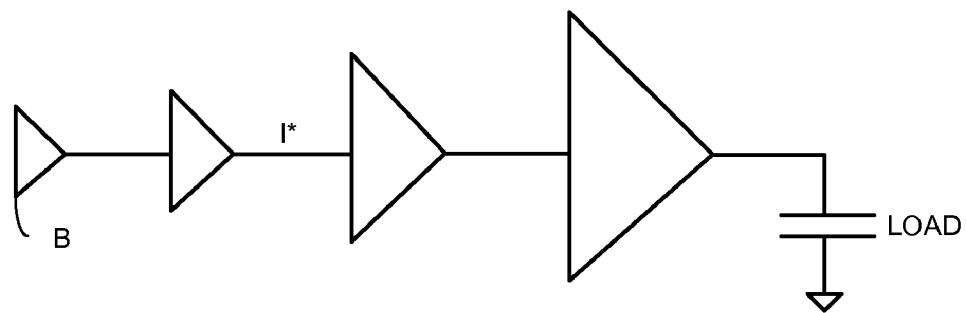
FIG. 7 presents a block diagram illustrating repeaters used to drive a long net in accordance with an embodiment of the present invention.

In some embodiments, the repeaters along a long wire are progressively increased in size the farther the repeaters are from the driving gate. In these embodiments, each successive repeater is assumed to be h times larger in area than the previous one, and they are inserted at the optimal inter-repeater distance l* (see FIG. 7). The first repeater in the repeater chain is the optimal repeater B*. For a long wire of length L and a load load at the sink node, k=L/l*−1 repeaters are inserted, and we assign $$h = \sqrt[k]{load/C}.$$

In some embodiments, the repeater that is h times larger than B* is assumed to have an input capacitance C·h and an output resistance R/h. Hence, according to the logical effort theory, the delay for the i-th repeater-to-repeater segment is:

$$d_i = R/h^i(cl^* + h^i C) + rl(cl^*/2 + h^i C) + \text{delay}_B^*(t^*, cl + h^i C)),$$

and the delay for the buffered wire is therefore $\Sigma 0 \leq i \leq k \, d_i$.

Virtual Physical Synthesis

The estimation of the post-physical-optimization timing using the VPS process is described below.

In some embodiments, given a placed design and a cell library, the input capacitances of the cells in design are estimated. In some embodiments, this estimate is obtained by backward traversal, starting from the timing endpoints. For a cell, an estimate of the load is first obtained. Then, the input capacitance of this cell is obtained from its load-capacitance model. If buffer chain insertion is to be performed, the load of a cell is the input capacitance of the buffer used for buffer chain insertion. If repeater insertion is to be performed, the load of the cell is the input capacitance of the repeater. Otherwise, the load is the total load of the cell (e.g., the sum of the capacitance of the net and the load of the sink pins).

Note that VPS does not perform buffer chain insertion and/or repeater insertion; instead VPS simulates/models the effects of buffer chain insertion and/or repeater insertion. Hence, although the discussion below refers to inserting buffer chains and/or repeaters, the insertion is a "virtual" insertion in which only the delay/timing is obtained. The netlist is not modified.

In some embodiments, for short nets in the design, the net delay is assumed to be negligible. If the current total load of the driving cell of the net is larger than the input capacitance of the buffer chosen for buffer chain insertion, buffer chain insertion is employed. In some embodiments, for multi-pin nets, the delay from the source pin to all the sink pins is assumed to be the same, whereas the load to the buffer chain is the total load of the driving cell.

Figure 8:
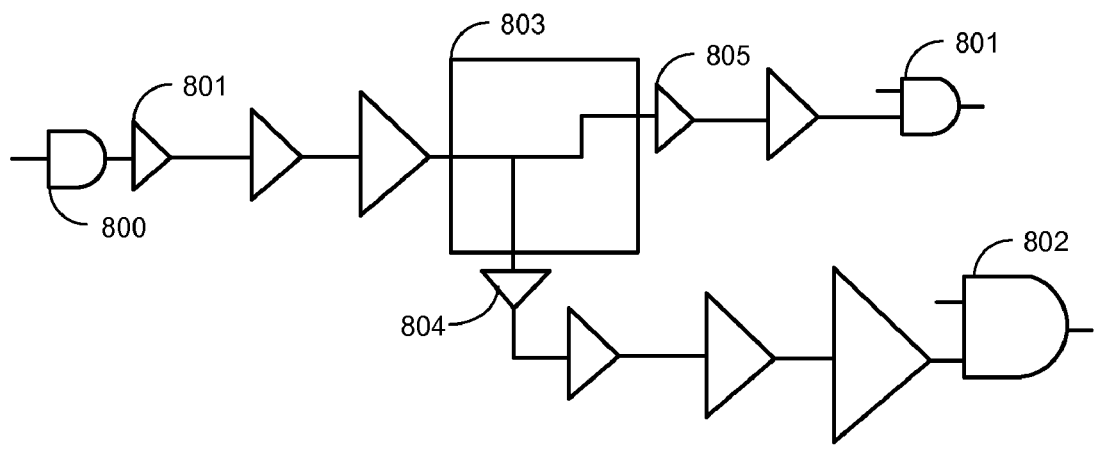
FIG. 8 presents a block diagram illustrating repeaters used to drive a long net which overlaps a macro in accordance with an embodiment of the present invention.

In some embodiments, for a long net in the design, repeater insertions are modeled as follows. Given a net, a Steiner route for the net is generated. If the route goes through a large hard macro (e.g., macro 803 in FIG. 8) where placement of buffers is prohibited, repeaters are inserted after the hard macro (see buffers 804-805 in FIG. 8). This models what physical synthesis would typically do in the presence of hard macros. For the segments of the net that are not inside the hard macros, these nets are then buffered (e.g., buffers are added at equal distance l*, where l* is a substantially optimal distance between two buffers as calculated above). In some embodiments, a buffer 801 is added after the driving cell 800. Using the Elmore delay model, the delay from the driver of the net to a sink is calculated by adding up the delay of each segment of the net which has been buffered.

FIGS. 9-15 present a summary of the VPS process.

Figure 9:
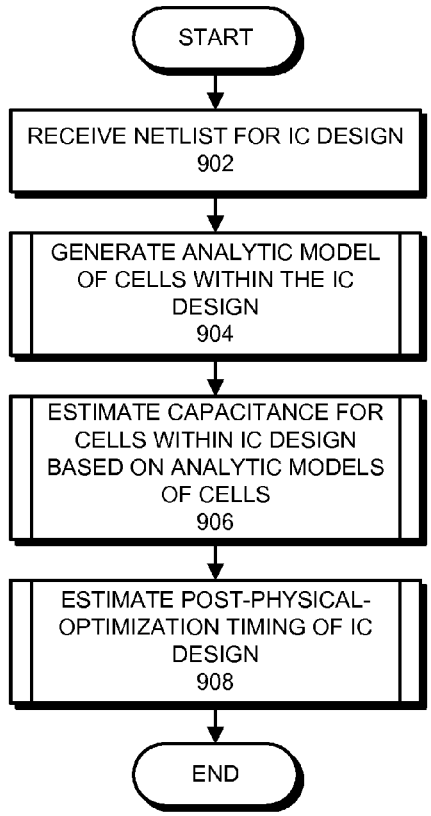
FIG. 9 presents a flow chart illustrating the process of determining the timing of an IC design in accordance with an embodiment of the present invention.

FIG. 9 presents a flow chart illustrating the process of determining the timing of an IC design in accordance with an embodiment of the present invention. The process begins when the system receives a netlist for the IC design (step 902), wherein the netlist specifies the placement of cells within the IC design. In some embodiments, the netlist includes logic that has been substantially optimized using a pre-placement-based logic optimization technique that does not account for the placement of logic while performing logic optimization. The system then generates analytic models of the cells within the IC design (step 904). Step 904 is described in more detail with reference to FIGS. 10-12 below. Next, the system estimates capacitances for cells within the IC design based on analytic models of the cells (step 906). Step 906 is described in more detail with reference to FIG. 13 below. The system then estimates the post-physical-optimization timing of the IC design (step 908) based on the netlist, the capacitances, and the analytic models, wherein the post-physical-optimization timing is estimated without performing physical optimization. Step 908 is described in more detail with reference to FIGS. 14-15 below.

Figure 10:
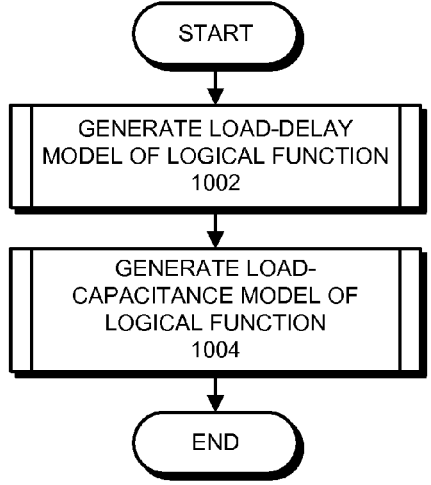
FIG. 10 presents a flow chart illustrating the process of generating analytic models of logical functions in accordance with an embodiment of the present invention.

FIG. 10 presents a flow chart illustrating the process of generating analytic models of logical functions in accordance with an embodiment of the present invention. The process begins when the system generates a load-delay model of the logical function (step 1002) which returns the minimum delay achievable for the logical function for a given output load. Step 1002 is described in more detail with reference to FIG. 11 below. The system then generates a load-capacitance model of the logical function (step 1004) which returns the input capacitance of a cell that achieves the minimum delay for a given output load. Step 1004 is described in more detail with reference to FIG. 12 below.

Figure 11:
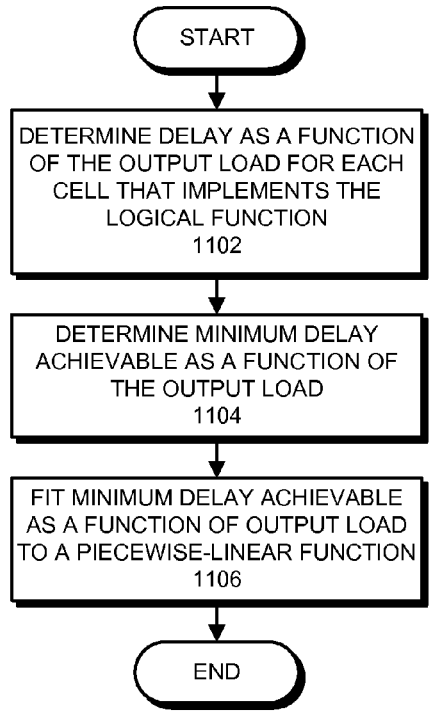
FIG. 11 presents a flow chart illustrating the process of generating a load-delay model of logical functions in accordance with an embodiment of the present invention.

FIG. 11 presents a flow chart illustrating the process of generating a load-delay model of logical functions in accordance with an embodiment of the present invention. The process begins when the system determines the delay as a function of the output load for each cell that implements the logical function (step 1102). Next, the system determines the minimum delay achievable as a function of output load for the logical function from the determined delays (step 1104). The system then fits the minimum delay achievable as a function of output load to a piecewise linear function (step 11106).

Figure 12:
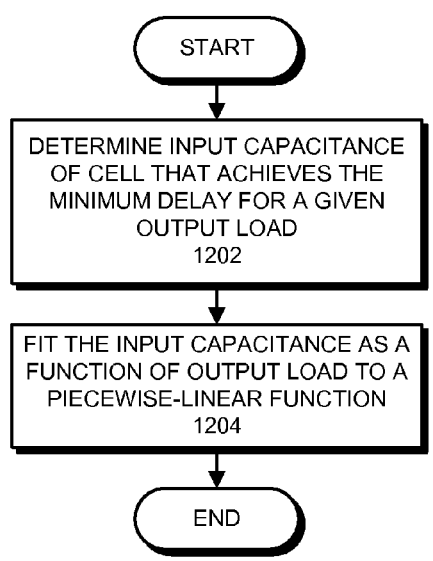
FIG. 12 presents a flow chart illustrating the process of generating a load-capacitance model of logical functions in accordance with an embodiment of the present invention.

FIG. 12 presents a flow chart illustrating the process of generating a load-capacitance model of logical functions in accordance with an embodiment of the present invention. The process begins when the system determines the input capacitance of the cell that achieves the minimum delay for a given output load (step 1202). The system then fits the input capacitance as a function of output load to a piecewise-linear function (step 1204).

FIG. 13 presents a flow chart illustrating the process of estimating capacitances for cells in accordance with an embodiment of the present invention. Starting from timing endpoints of the IC design, the system estimates the output load of cells coupled to the timing endpoints (step 1302). The system then recursively determines the input capacitance of the cells using the load-capacitance model (step 1304) until the inputs to the IC design are reached.

In some embodiments, the load coupled to the timing endpoints includes one or more of: the input capacitance of a buffer used for buffer chain insertion; the input capacitance of a repeater buffer used to drive a long net; and the sum of the capacitance of the net coupled to the timing endpoints and the load caused by the input to the next stage of cells coupled to the timing endpoints.

In some embodiments, for nets which are less than or equal to a specified length, the system performs buffer insertion to drive large loads. FIG. 14 presents a flow chart illustrating the process of inserting buffers to drive large loads in accordance with an embodiment of the present invention. The process begins when the system determines whether an output load for the driving cell is larger than a specified capacitance (step 1402). If so (step 1404, yes), the system inserts a specified number of stages of buffers between the driving cell and the output load (step 1406), wherein the drive strength of the buffers in a given stage is a specified factor more than the drive strength of the buffers in the previous stage. The system then calculates the post-physical-optimization timing of the buffered net by multiplying the specified number of stages by the delay of the first stage of buffers (step 1408). Otherwise (step 1404, no), the system determines the delay based on the load-delay model (step 1410).

Figure 15:
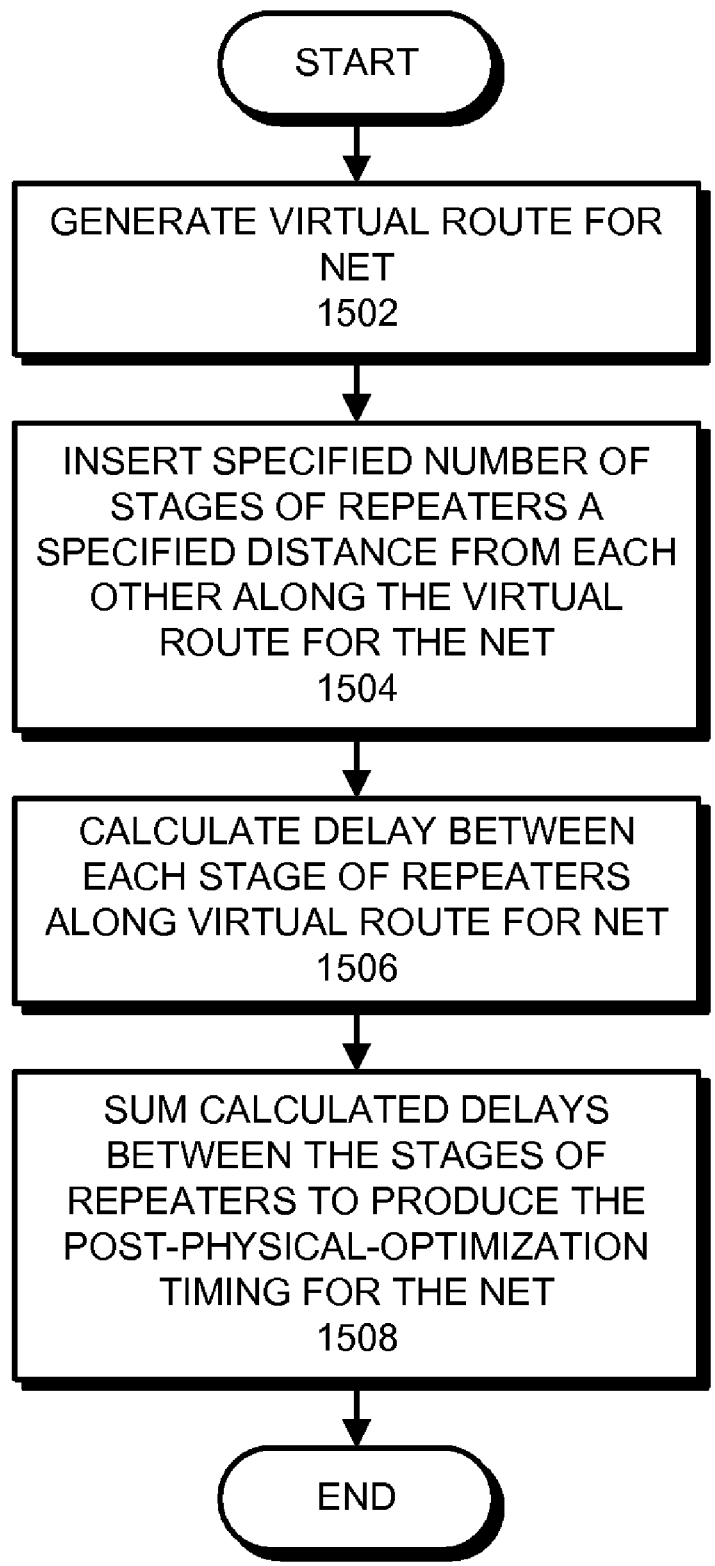
FIG. 15 presents a flow chart illustrating the process of inserting repeaters to drive long nets in accordance with an embodiment of the present invention.

In some embodiments, for nets which are greater than a specified length, the system inserts repeaters to drive long nets. FIG. 15 presents a flow chart illustrating the process of inserting repeaters to drive long nets in accordance with an embodiment of the present invention. The process begins when the system generates a virtual route for the net (step 1502). The system then inserts a specified number of stages of repeaters a specified distance from each other along the virtual route for the net (step 1504). Next, the system calculates the delay between each stage of repeaters along the virtual route for the net (step 1506). The system then sums the calculated delays between the stages of repeaters to produce the post-physical-optimization timing for the net (step 1508). In some embodiments, the system inserts a repeater after a driver of the net. In some embodiments if the virtual route overlaps with a macro which does not allow the placement of repeaters, the system inserts a repeater after the macro. In some embodiments, the size of the repeater for a given stage is a specified factor greater than the size of the repeater in the previous stage.

Virtual Physical Synthesis Results

Table 1 presents exemplary comparisons between the results obtained from embodiments of the present invention and results obtained from physical synthesis in accordance with an embodiment of the present invention. VPS is compared with a commercial physical synthesis tool on 13 industrial designs. For each design, the worst negative slacks (WNS) predicted by VPS versus the result of the actual physical synthesis are compared. Prediction error is the absolute difference between the WNS as a fraction of the clock period. The runtimes are also compared. On average VPS is 78× faster than actual physical synthesis and within 11% error in WNS.

TABLE 1

VPS vs. ICC physical synthesis: WNS and runtime

|  | #cells | Clock Period (ns) | Original WNS (ns) | VPS WNS (ns) | P-SYN WNS (ns) | Error (%) | Speedup (X) |
|---|---|---|---|---|---|---|---|
| D1 | 22K | 10 | −107.48 | 0.79 | −2.93 | 37.26 | 193 |
| D2 | 23K | 11 | −6.31 | −6.18 | −5.10 | 9.81 | 207 |
| D3 | 24K | 5.2 | −15.93 | −7.42 | −6.01 | 26.97 | 149 |
| D4 | 57K | 288 | −4.23 | −0.01 | −0.46 | 0.15 | 62 |
| D5 | 65K | 10 | −881.24 | 0.43 | 0.00 | 4.33 | 32 |
| D6 | 86K | 3.63 | −3.14 | −0.28 | −0.13 | 4.16 | 59 |
| D7 | 161K | 5.8 | −8.82 | −3.51 | −2.37 | 19.69 | 69 |
| D8 | 292K | 5.4 | −8.77 | −1.01 | −1.98 | 17.97 | 34 |
| D9 | 330K | 200 | −8.43 | −1.57 | −2.21 | 0.32 | 30 |
| D10 | 395K | 21.6 | −14.83 | −8.19 | −8.61 | 1.96 | 31 |
| D11 | 396K | 13 | −86.02 | −2.55 | −3.01 | 3.54 | 51 |
| D12 | 504K | 60 | −4.40 | −1.53 | −2.65 | 1.87 | 18 |
| D13 | 613K | 100 | −285.43 | −264.35 | −268.29 | 3.94 | 72 |
| Average |  |  |  |  |  | 10.15 | 78 |

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for determining post-physical-optimization timing of an integrated circuit (IC) design, comprising:
   receiving a netlist for the IC design, wherein the netlist specifies the placement of cells within the IC design;
   estimating capacitances for cells within the IC design based on analytic models of the cells; and
   for a net which is less than or equal to a specified length, in response to determining that an output load for a driving cell is greater than a specified capacitance,
      determining a buffered net by inserting a specified number of stages of buffers between the driving cell and the output load, wherein the drive strength of the buffers in a given stage is a specified factor more than the drive strength of the buffers in the previous stage,
      calculating, by using one or more computers, the post-physical optimization timing of the buffered net by multiplying the specified number of stages by the delay of the first stage of buffers, and
   in response to determining that the output load for the driving cell is less than the specified capacitance, determining the delay based on a load-delay model.

2. The method of claim 1, wherein the netlist includes logic that has been substantially optimized using a pre-placement-based logic optimization technique that does not account for the placement of logic while performing logic optimization.

3. The method of claim 1, wherein prior to estimating the capacitances for the cells based on the analytic models of the cells, the method further comprises generating analytic models of the cells within the IC design.

4. The method of claim 3, wherein generating the analytic models of the cells involves generating an analytic model for each logical function within the IC design.

5. The method of claim 4, wherein generating the analytic model for each logical function involves:
   generating a load-delay model of the logical function which returns the minimum delay achievable for the logical function for a given output load; and
   generating a load-capacitance model of the logical function which returns the input capacitance of a cell that achieves the minimum delay for a given output load.

6. The method of claim 5, wherein generating the load-delay model of the logical function involves:

determining the delay as a function of the output load for each cell that implements the logical function;

determining the minimum delay achievable as a function of output load for the logical function from the determined delays; and fitting the minimum delay achievable as a function of output load to a piecewise linear function.

7. The method of claim 5, wherein generating the load-capacitance model of the logical function involves:

determining the input capacitance of the cell that achieves the minimum delay for a given output load; and fitting the input capacitance as a function of output load to a piecewise-linear function.

8. The method of claim 5, wherein estimating capacitances for cells within the IC design based on analytic models of the cells involves:

starting from timing endpoints of the IC design, estimating the output load of cells coupled to the timing endpoints; and recursively determining the input capacitance of the cells using the load capacitance model until the inputs to the IC design are reached.

9. The method of claim 8, wherein the load coupled to the timing endpoints includes one or more of:

the input capacitance of a buffer used for buffer chain insertion;

the input capacitance of a repeater buffer used to drive a long net; and the sum of the capacitance of the net coupled to the timing endpoints and the load caused by the input to the next stage of cells coupled to the timing endpoints.

10. The method of claim 1, wherein for a net which is greater than a specified length, estimating the post-physical-optimization timing of the IC design without modifying the net involves:

generating a virtual route for the net;

inserting a specified number of stages of repeaters a specified distance from each other along the virtual route for the net;

calculating the delay between each stage of repeaters along the virtual route for the net; and summing the calculated delays between the stages of repeaters to produce the post-physical-optimization timing for the net.

11. The method of claim 10, wherein the method further comprises inserting a repeater after a driver of the net.

12. The method of claim 10, wherein if the virtual route overlaps with a macro which does not allow the placement of repeaters, the method further comprises inserting a repeater after the macro.

13. The method of claim 10, wherein the size of the repeater for a given stage is a specified factor greater than the size of the repeater in the previous stage.

14. A non-transitory computer-readable storage medium storing instructions that when executed by a computer cause the computer to perform a method for determining post-physical-optimization timing of an integrated circuit (IC) design, wherein the method comprises:

receiving a netlist for the IC design, wherein the netlist specifies the placement of cells within the IC design;

estimating capacitances for cells within the IC design based on analytic models of the cells; and for a net which is less than or equal to a specified length, in response to determining that an output load for a driving cell is greater than a specified capacitance, determining a buffered net by inserting a specified number of stages of buffers between the driving cell and the output load, wherein the drive strength of the buffers in a given stage is a specified factor more than the drive strength of the buffers in the previous stage, calculating the post-physical-optimization timing of the buffered net by multiplying the specified number of stages by the delay of the first stage of buffers, and in response to determining that the output load for the driving cell is less than the specified capacitance, determining the delay based on a load-delay model.

15. The computer-readable storage medium of claim 14, wherein the netlist includes logic that has been substantially optimized using a pre-placement-based logic optimization technique that does not account for the placement of logic while performing logic optimization.

16. The computer-readable storage medium of claim 14, wherein prior to estimating the capacitances for the cells based on the analytic models of the cells, the method further comprises generating analytic models of the cells within the IC design.

17. The computer-readable storage medium of claim 16, wherein generating the analytic models of the cells involves generating an analytic model for each logical function within the IC design.

18. The computer-readable storage medium of claim 17, wherein generating the analytic model for each logical function involves:

generating a load-delay model of the logical function which returns the minimum delay achievable for the logical function for a given output load; and generating a load-capacitance model of the logical function which returns the input capacitance of a cell that achieves the minimum delay for a given output load.

19. The computer-readable storage medium of claim 18, wherein generating the load-delay model of the logical function involves:

determining the delay as a function of the output load for each cell that implements the logical function;

determining the minimum delay achievable as a function of output load for the logical function from the determined delays; and fitting the minimum delay achievable as a function of output load to a piecewise linear function.

20. The computer-readable storage medium of claim 18, wherein generating the load-capacitance model of the logical function involves:

determining the input capacitance of the cell that achieves the minimum delay for a given output load; and fitting the input capacitance as a function of output load to a piecewise-linear function.

21. The computer-readable storage medium of claim 18, wherein estimating capacitances for cells within the IC design based on analytic models of the cells involves:

starting from timing endpoints of the IC design, estimating the output load of cells coupled to the timing endpoints; and recursively determining the input capacitance of the cells using the load capacitance model until the inputs to the IC design are reached.

22. The computer-readable storage medium of claim 21, wherein the load coupled to the timing endpoints includes one or more of:

the input capacitance of a buffer used for buffer chain insertion;

the input capacitance of a repeater buffer used to drive a long net; and the sum of the capacitance of the net coupled to the timing endpoints and the load caused by the input to the next stage of cells coupled to the timing endpoints.

23. The computer-readable storage medium of claim 14, wherein for a net which is greater than a specified length, estimating the post-physical-optimization timing of the IC design without modifying the net involves:
    generating a virtual route for the net;
    inserting a specified number of stages of repeaters a specified distance from each other along the virtual route for the net;
    calculating the delay between each stage of repeaters along the virtual route for the net; and
    summing the calculated delays between the stages of repeaters to produce the post-physical-optimization timing for the net.

24. The computer-readable storage medium of claim 23, wherein the method further comprises inserting a repeater after a driver of the net.

25. The computer-readable storage medium of claim 23, wherein if the virtual route overlaps with a macro which does not allow the placement of repeaters, the method further comprises inserting a repeater after the macro.

26. The computer-readable storage medium of claim 23, wherein the size of the repeater for a given stage is a specified factor greater than the size of the repeater in the previous stage.

27. An apparatus that determines post-physical-optimization timing of an integrated circuit (IC) design, comprising:
    a receiving mechanism configured to receive a netlist for the IC design, wherein the netlist specifies the placement of cells within the IC design;
    a capacitance-estimation mechanism configured to estimate capacitances for cells within the IC design based on analytic models of the cells; and
    a timing estimation mechanism configured to:
        for a net which is less than or equal to a specified length, in response to determining that an output load for a driving cell is greater than a specified capacitance, determine a buffered net by inserting a specified number of stages of buffers between the driving cell and the output load, wherein the drive strength of the buffers in a given stage is a specified factor more than the drive strength of the buffers in the previous stage,
        calculate the post-physical-optimization timing of the buffered net by multiplying the specified number of stages by the delay of the first stage of buffers, and
        in response to determining that the output load for the driving cell is less than the specified capacitance, determine the delay based on a load-delay model.

28. A method for determining post-physical-optimization timing of an integrated circuit (IC) design, comprising:
    receiving a netlist for the IC design, wherein the netlist specifies the placement of cells within the IC design;
    estimating capacitances for cells within the IC design based on analytic models of the cells;
    for a net which is greater than a specified length, estimating the post-physical-optimization timing of the IC design without modifying the net by:
        generating a virtual route for the net,
        inserting a specified number of stages of repeaters a specified distance from each other along the virtual route for the net,
        calculating, using one or more computers, the delay between each stage of repeaters along the virtual route for the net, and
        summing the calculated delays between the stages of repeaters to produce the post-physical-optimization timing for the net.

29. A non-transitory computer-readable storage medium storing instructions that when executed by a computer cause the computer to perform a method for determining post-physical-optimization timing of an integrated circuit (IC) design, wherein the method comprises:
    receiving a netlist for the IC design, wherein the netlist specifies the placement of cells within the IC design;
    estimating capacitances for cells within the IC design based on analytic models of the cells; and
    for a net which is greater than a specified length, estimating the post-physical-optimization timing of the IC design without modifying the net by:
        generating a virtual route for the net,
        inserting a specified number of stages of repeaters a specified distance from each other along the virtual route for the net,
        calculating the delay between each stage of repeaters along the virtual route for the net, and
        summing the calculated delays between the stages of repeaters to produce the post-physical-optimization timing for the net.

* * * * *